United States Patent [19]

Priel et al.

[11] 4,196,228

[45] Apr. 1, 1980

[54] FABRICATION OF HIGH RESISTIVITY SEMICONDUCTOR RESISTORS BY ION IMPLANATATION

[75] Inventors: Ury Priel, Cupertino; Jerry D. Gray, San Jose; Allen H. Frederick, Pacifica, all of Calif.

[73] Assignee: Monolithic Memories, Inc., Sunnyvale, Calif.

[21] Appl. No.: 926,626

[22] Filed: Jul. 21, 1978

Related U.S. Application Data

[62] Division of Ser. No. 805,534, Jun. 10, 1978, Pat. No. 4,152,627.

[51] Int. Cl.$^2$ .................. H01L 21/425; H01L 21/441
[52] U.S. Cl. ..................................... 427/88; 430/313; 156/659.1; 357/91; 250/492 A; 148/1.5; 427/38; 427/93; 427/101; 427/102; 427/103
[58] Field of Search ................. 148/1.5; 427/101–103, 427/38, 85, 88, 93; 152/659; 357/91; 250/492 A; 96/36.2

[56] References Cited

U.S. PATENT DOCUMENTS

| 3,873,371 | 3/1975 | Wolf | 427/88 |
| 3,879,236 | 4/1975 | Langdon | 427/102 |
| 3,920,483 | 11/1975 | Johnson et al. | 427/38 |
| 4,088,799 | 5/1978 | Kurtin | 427/38 |
| 4,110,776 | 8/1978 | Rao et al. | 357/91 |

Primary Examiner—John D. Smith
Attorney, Agent, or Firm—Harry M. Weiss

[57] ABSTRACT

This disclosure relates to a low power write-once, read-only semiconductor memory (PROM or programmable read only memory) array wherein the semiconductor resistors located in the word line decoder and driver and also in the bit line decoder and sense amplifier of the memory array are fabricated to have a high resistivity thereby permitting the semiconductor array to operate with much lower power. The high resistivity semiconductor resistors of this write-once, read-only semiconductor memory array are fabricated using an ion implantation step, preferably, between the base and emitter diffusion process steps in fabricating the NPN transistor structures used in the bit line and word line decoders of the memory array. The high resistivity ion implanted resistor regions are preferably shallow, boron implanted regions that are formed by ion implanting through a thin silicon dioxide layer. Various resistor devices are disclosed using shallow, boron implanted, high resistivity regions. Also disclosed are PNP transistor devices (both vertical and lateral types) having P type emitter regions preferably made with a Boron implant. A P-channel MOS device is also disclosed where the P+ source and drain regions are shallow, implanted regions.

4 Claims, 8 Drawing Figures

STEP E

STEP H

STEP F

STEP I

STEP G

STEP J

PNP

P CHANNEL MOS

LATERAL PNP ll
FABRICATION OF HIGH RESISTIVITY SEMICONDUCTOR RESISTORS BY ION IMPLANATATION

CROSS-REFERENCES TO RELATED APPLICATION

The subject matter disclosed herein is a division of patent application Ser. No. 805,534; filed June 10, 1977 by Priel et al and issuing as U.S. Pat. No. 4,152,627 on May 1, 1979.

BACKGROUND OF THE INVENTION

1. Field of the Invention

This invention relates generally to write-once, read-only semiconductor memory arrays and, more specifically, to lower power write-once, read-only semiconductor memory arrays including semiconductor devices and fabrication methods therefor.

2. Description of the Prior Art

In the past, manufacturers of semiconductor write-once, read-only (PROM) memory arrays have sought ways of producing lower power semiconductor memory arrays in order to permit users of these arrays to operate them with much lower power.

One recent technique that has been implemented by some semiconductor circuit manufacturers to provide low power semiconductor circuits has been to use high resistivity resistors in place of conventional resistors used in the circuit in order to reduce the power needed to operate the circuits. However, prior attempts to improve circuit operation by developing semiconductor circuits that operate with lower power have not been very satisfactory due to the difficulty in forming high resistivity, shallow semiconductor resistor regions. For example, diffused semiconductor resistors were found to be undesirable due to the fact that the graded diffused region after diffusing through an opening in the silicon dioxide layer into the bare silicon generally created very deep semiconductor regions which reduced the resistivity of these resistor regions because resistivity is inversely proportional to region thickness.

Prior attempts to produce high resistivity ion implanted semiconductor resistor regions have not been successful because these ion implanted semiconductor resistor regions were performed through openings in the silicon dioxide surface layer thereby causing relatively deep semiconductor resistor regions which lowered the resistance of these semiconductor regions.

Attempts at making shallow P type diffused or implanted regions with Boron through openings in the silicon dioxide layer were not successful because of the fact that Boron outdiffused into the thermally grown silicon dioxide layer thereby resulting in the loss of the initially formed, shallow, high resistivity Boron doped resistor region.

Accordingly, a need existed to provide a low power programmable read-only semiconductor memory array which would have very shallow, high resistivity semiconductor resistor regions or structures to thereby lower the power needed to operate the semiconductor PROM.

SUMMARY OF THE INVENTION

Accordingly, it is an object of this invention to provide an improved programmable read-only semiconductor memory array.

It is another object of this invention to provide an improved high resistivity, shallow, semiconductor resistor device.

It is a further object of this invention to provide a method for making a high resistivity, shallow, semiconductor resistor region or device.

It is still another object of this invention to provide improved semiconductor devices having shallow, low resistivity regions.

DESCRIPTION OF THE PREFERRED EMBODIMENTS

In accordance with one embodiment of this invention, a programmable read-only memory array is disclosed which comprises a plurality of memory cells. Each of the memory cells has a first electrical state prior to receiving a writing signal and an irreversible different second electrical state after receiving a writing signal. Writing means are provided which are electrically connected to the plurality of memory cells for selecting and writing information into any of the plurality of memory cells and placing the selected memory cells in the irreversible different second electrical state. Reading means are provided for sensing the information contained in the plurality of memory cells. The memory array also includes high resistivity resistor device means located in at least one of the writing means and the reading means for reducing the power needed to operate the memory array. Preferably, the high resistivity resistor device means are located in the Word line decoder and driver as well as in the Bit line decoder and sense amplifier. The resistor device means comprises a shallow, high resistivity region having a depth of no greater than about 0.5 microns.

In accordance with another embodiment of this invention, a high resistivity semiconductor resistor device is disclosed which comprises a semiconductor region of one conductivity type. An insulating layer is located on a surface of the semiconductor region. A shallow high resistivity region having a depth of no greater than about 0.5 microns is located in the semiconductor region of one conductivity type and in contact with the insulating layer. The shallow high resistivity region has a higher resistivity than the semiconductor region of one conductivity type and also contains impurities of opposite conductivity type. A pair of spaced semiconductor resistor contact regions having a depth greater than the shallow high resistivity region and having the same conductivity as the shallow high resistivity region is located in contact with the semiconductor region of one conductivity type. The shallow high resistivity region is in electrical contact with each one of the pair of semiconductor resistor contact regions. An electrical ohmic contact is provided to each one of the pair of semiconductor resistor contact regions.

In accordance with still another embodiment of this invention, a semiconductor transistor device is disclosed which comprises an emitter region, a base region and a collector region located within a semiconductor substrate having one surface thereof covered by an insulating layer. An electrical contact is provided to the emitter region, the base region and the collector region. The emitter region is in contact with the insulating layer and has a depth of no greater than about 0.5 microns. Preferably, the emitter region contains Boron implanted ions in a PNP type transistor device or Arsenic or Phosphorous implanted ions in a NPN type transistor device.

The base region for a PNP transistor device is also a shallow region and contains Arsenic implanted ions.

Another embodiment discloses a lateral PNP transistor device where the emitter region is a shallow, high conductivity Boron implanted region and the collector region is a conventionally diffused P region formed during the process of making a base region for a NPN transistor device.

A further embodiment discloses a MOS transistor device wherein the Source and Drain regions are shallow, high conductivity or low resistivity ion implanted regions.

The foregoing and other objects, features and advantages of the invention will be apparent from the following more specific description covering preferred embodiments as illustrated in the accompanying drawings.

BRIEF DESCRIPTION OF THE DRAWINGS

Referring to FIG. 1, a semiconductor chip 10 is shown which contains a programmable read-only, semiconductor memory array or PROM. The programmable read-only, semiconductor memory array contains a Word Line Decoder and Driver 12 connected up to each of a plurality of Word lines 14 for selecting and driving any one of the Word lines 14. The array also contains a Bit Line Decoder and Sense Amplifier 16 connected up to a plurality of Bit lines 18 for selecting and sensing any one of the Bit lines 18. Connected between each of the Word lines 14 and the Bit lines 18 is a memory element 20 (not all are shown) which preferably contains a Nichrome fusable link 22 connected to a diode 24. Only one of the memory elements 20 is shown in detail. If desired, other materials can be used for the fusable link such as Titanium-Tungsten or Polysilicon.

In performing a Write "1" operation, for example, the Nichrome fusable link 22 is blown to provide an "open" by means of applying a current of a sufficient cumulative magnitude to both the selected Word line 14 and the selected Bit line 18 associated with the particular memory cell 20 that a "1" is desired to be written into. If desired, a Write 37 0" operation can be performed by blowing the fusable link 22 depending on the choice of a definition of a "1" or a "0".

Figure 1:
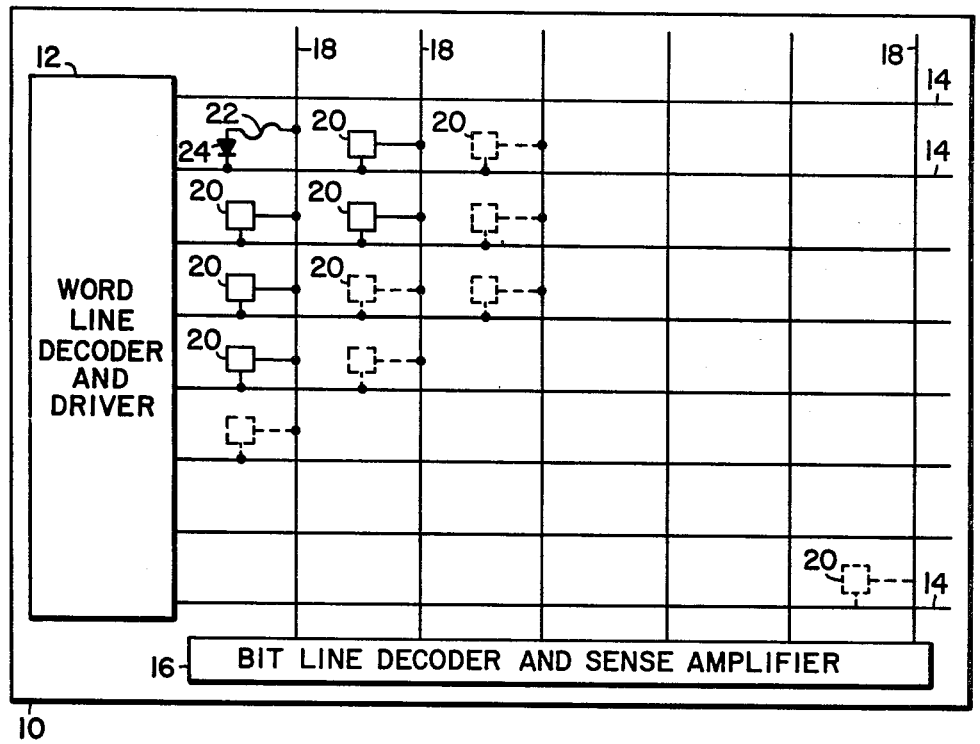
FIG. 1 is a representation of a low power PROM semiconductor chip layout partly in schematic and block diagram form illustrating one embodiment of this invention which utilizes shallow, high resistivity semiconductor resistors in one or both Decoder blocks.
Figure 2A:
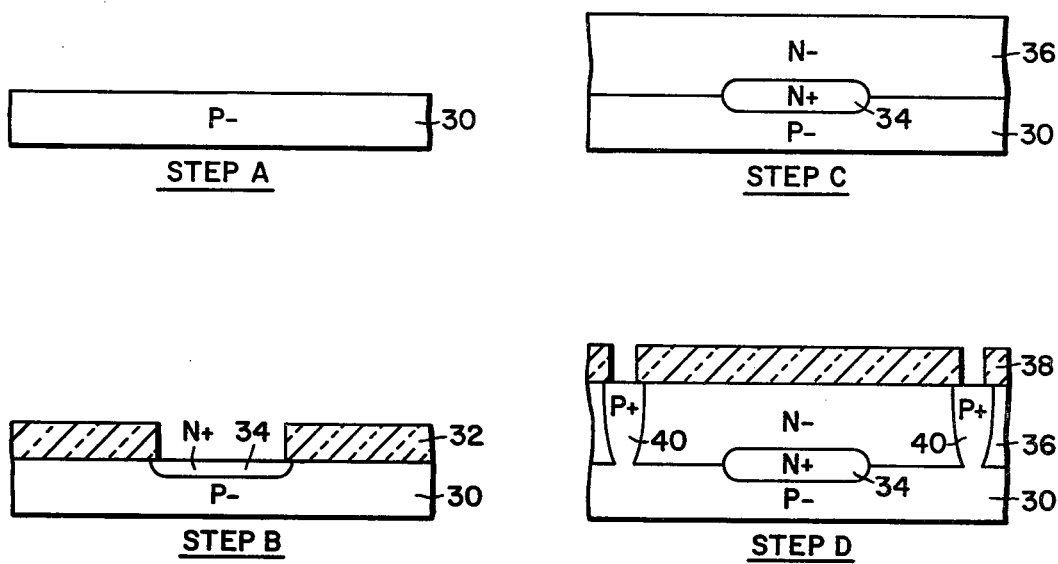
FIG. 2A depicts a series of Steps A-D illustrating the first four Steps, in cross-sectional elevational views, for fabricating a shallow, high resistivity semiconductor resistor in accordance with this invention.
Figure 2B:
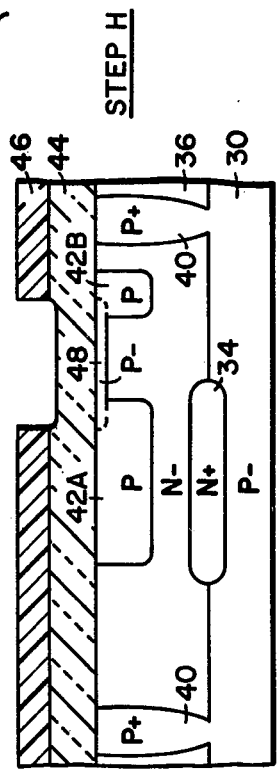
FIG. 2B depicts a series of Steps E-J illustrating the last six Steps, in cross-sectional elevational views, for fabricating the shallow, high resistivity semiconductor resistor of FIG. 2A.
Figure 2B:
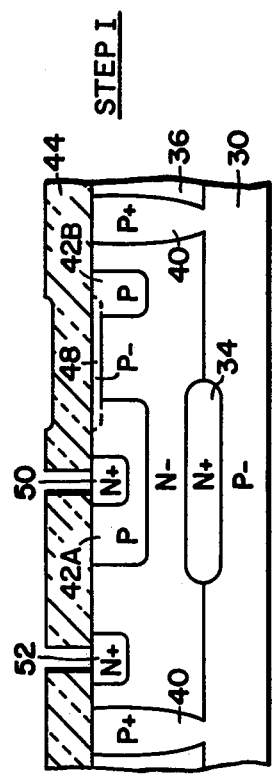
Figure 2B:
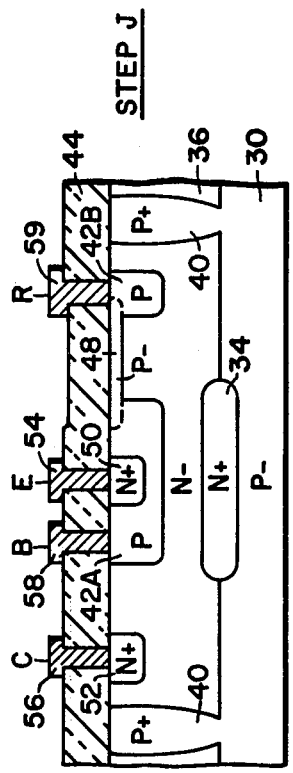
Figure 2B:
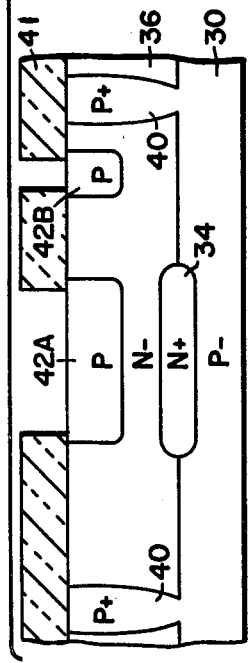
Figure 2B:
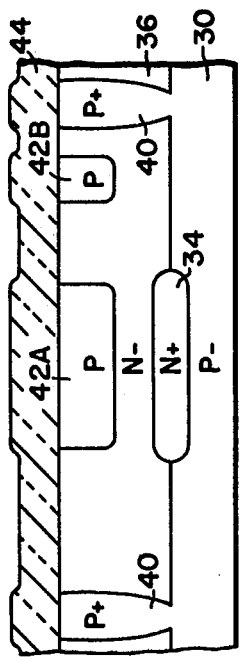
Figure 2B:
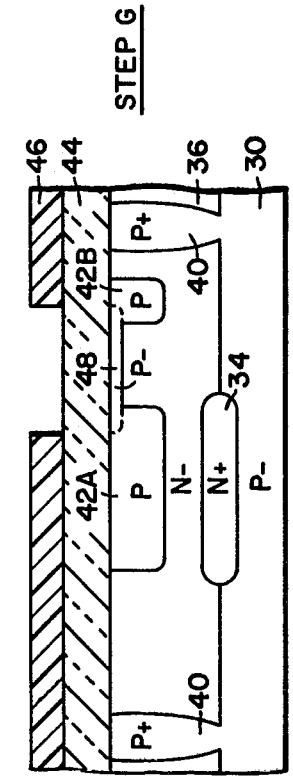

FIGS. 2A and 2B illustrate ten Steps in the process of making an integrated bipolar transistor-resistor structure having a shallow, high resistivity resistor connected to the base of an NPN transistor. One or more of these devices are used in the circuits of the Word Line Decoder and Driver 12 and/or the Bit Line Decoder And Sense Amplifier 16 in order to reduce the power needed to operate the programmable read-only semiconductor memory array shown in FIG. 1. If desired, other high resistivity resistor device structures as shown, for example, in FIGS. 3, 4 or 5 (without integration with a transistor) can be used in the Bit Line Decoder And Sense Amplifier circuits 16 of FIG. 1 and/or in the Word Line Decoder And Driver circuits 12 of FIG. 1.

Referring to FIG. 2A, Step A depicts a starting substrate 30 of P— type conductivity, preferably, having a resistivity of, for example, 10 to 20 ohms-centimeter and a thickness of about 10 mils. The substrate 30 is preferably a monocrystalline silicon semiconductor structure which can be fabricated by conventional wafer fabrication techniques such as by pulling a rod shaped silicon semiconductor member from a P doped melt and then slicing the rod into wafers. The substrate 30 is a portion of one such wafer.

Referring to Step B of FIG. 2A, a silicon dioxide coating or layer 32, preferably, having a thickness of, for example, about 7000 Angstrom units is either thermally grown or pyrolitically deposited on a surface of the P— substrate 30. An opening is formed in the silicon dioxide layer 32 to permit a N+ diffusion operation to form N+ diffused region 34. Preferably, the N+ diffused region 34 is formed using Arsenic impurities.

Referring to Step C of FIG. 2A, a layer 36 of N-type conductivity, preferably having a resistivity of, for example, about 0.50 ohms-centimeter, is epitaxially grown on the surface of the substrate 30 after removal of the silicon dioxide layer 32 following the formation of the N+ subcollector region 34. The epitaxial layer 36 is, preferably, an arsenic doped layer approximately, for example, 5 microns thick.

Referring to Step D of FIG. 2A, silicon dioxide layer 38 is regrown on the surface of the N— type epitaxial layer 36 and a moat shaped opening is then formed in the silicon dioxide layer 38 by conventional photolithographic oxide masking and etching techniques prior to carrying out an isolation P+ type diffusion operation to form P+ isolation moat 40 in the N— epitaxial layer 36 to isolate a central N— epitaxial region 36.

Referring to Step E of FIG. 2B, additional silicon dioxide material (layer 41) is grown on the surface of the substrate 30 containing the epitaxially grown layer 36. Two openings are formed therein by conventional photolithographic oxide masking and etching techniques. Subsequent to the formation of the openings in the silicon dioxide layer 41, a base type P diffusion operation is carried out to form the base type region 42A and a resistor contact region 42B in the N— epitaxial region 36 as shown in Step E of FIG. 2B.

Referring to Step F of FIG. 2B, the entire surface oxide layer 41 is first removed and then a new thin silicon dioxide layer about 3000–4000 Angstroms thick is grown to form the silicon dioxide layer 44 which contains bumps or elevated portions on the surface thereof coinciding with the diffused regions located in the N— epitaxial layer 36 beneath the silicon dioxide layer 44. Thus, an elevated region, or oxide bump is formed on the silicon dioxide layer 44 above both P type base diffusion regions 42A and 42B and above the isolation moat 40 which helps to provide a visual identification of the space between and location of the P type regions 42A and 42B within the moat 40 that will eventually serve as the base (one of the resistor contacts) and resistor contact regions of the integrated transistor-resistor structure. These elevated portions or bumps are formed on the silicon dioxide layer 44 during the thermal oxide growth operation in forming the silicon dioxide layer 44 due to the fact that thermal oxide growth over a doped diffusion region creates a thicker oxide over that region than over an undoped region.

Referring to Step G of FIG. 2B, a photoresist layer is deposited onto the surface of the thin silicon dioxide layer 44. The photoresist layer 46 preferably has a thickness of from 7,000–8,000 Angstroms and has an opening formed therein by conventional techniques for forming openings in photoresist layers. The opening in the photoresist layer 46 is located on the portion of the thin silicon dioxide layer 44 that is spaced over a region that is located between the P type regions 42A and 42B.

In Step G, an ion implantation step is carried out through the opening in the photoresist layer 46 and through the thin silicon dioxide layer 44, preferably, using Boron ions in order to form a shallow, P type, high resistivity region 48 between the P regions 42A and 42B. The shallow high resistivity implanted region 48 has a resistivity in the range of from 500 to 10,000 ohm-centimeter and preferably about 1,500 ohms per square which is about 6 times higher in resistivity than the P diffused Base region 42A.

Referring to Step H, subsequent to the ion implantation step, the portion of the oxide layer 44 over the implanted P-region 48 is etched slightly using the same opening in the photoresist layer 46 in order to permit subsequent visual identification on the surface of the thin silicon dioxide layer 44 as to the location of the implanted region 48 to permit resistor contacts to be made thereto at P regions 42A and 42B. Preferably, the thickness of the shallow high resistivity resistor region 48 is initially only about 0.1 microns which will diffuse into the semiconductor substrate to no more than 0.5 microns during the remaining heating steps in the fabrication process. That is to say, the diffusion rate is reduced such that the resistor region does not grow so rapidly during subsequent heat processing steps and the resistivity value remains relatively stable with respect to the initially formed resistivity value.

Referring to Step I of FIG. 2B, openings are etched in the silicon dioxide layer 44 in order to form the N+ emitter region 50 and an N+ collector contact region 52 in the N− epitaxial region 36. If desired, the silicon dioxide layer 44 can be increased in thickness by a thermal growth step which will not affect the shallow P− region 48 because of the protection of the oxide layer 44.

Referring to Step J of FIG. 2B, this step illustrates the final device design wherein an integrated semiconductor structure contact 54 to the emitter region 50 which is formed by means of a metalization process to create an ohmic contact to the N+ region 50 through an etched opening in the silicon dioxide layer 44. A collector contact 56 is made to the collector contact region 52. A base contact 58 is made to the P type region 42A by means of a metal ohmic contact deposited through an opening in the silicon dioxide 44 to the P type region 42A. This contact 58 functions or serves as a base contact to the NPN transistor and also as a resistor contact to one portion of the resistor device formed by the shallow, high resistivity P− type region 48 located between the P type base region 42A and the P diffused resistor contact region 42B. A resistor contact 59 is connected to the P type region 42B to provide the other resistor contact for the shallow high resistivity region 48.

Figure 3:
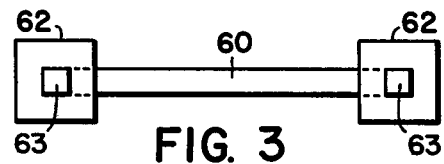
FIGS. 3, 4 and 5 depict top views of different semiconductor resistor devices as they would appear in a semiconductor chip with each device having a shallow, high resistivity semiconductor resistor region fabricated as shown in FIGS. 2A and 2B.

Referring to FIG. 3, a top view is shown of a resistor device similar (except without an integrated transistor) to the resistor device shown in Step J of FIG. 2B with a shallow implant region 60 located between a pair of deeper diffused or deep implanted resistor contact regions 62. Metal contacts 63 are provided to the semiconductor resistor contact regions 62. In this embodiment, the regions 62 are either separate P diffused regions in an N type epitaxial layer or N diffused regions in a P type epitaxial layer with the shallow region 60 being, for example, an arsenic or phosphorous implanted high resistivity region. The resistor contact regions 62 function to provide a deep diffused or implanted region that permits the shallow implant region 60 to be in electrical contact therewith and further permits a good metal ohmic contact to be made thereto without penetration through the resistor contact semiconductor region 62.

Figure 4:
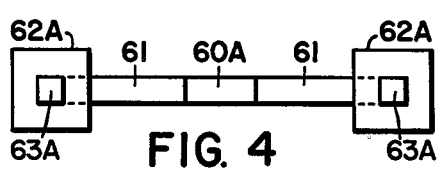

Referring to FIG. 4, another embodiment of a resistor type device is shown wherein a pair of spaced, deep diffused or implanted semiconductor resistor contact regions 62A are connected to a pair of similar deep diffused regions 61 which have a lower resistivity than intermediate shallow, high resistivity region 60A. Thus, this resistor device has a resistance composed of the three resistor values of the two semiconductor regions 61 and the high resistivity implanted regions 60A. The letter A has been added to corresponding reference numerals in FIG. 3 for showing similar elements in FIG. 4.

Figure 5:
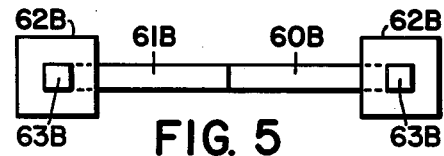

Another resistor device embodiment is shown in FIG. 5. Here, the deep diffused resistor contact regions 62B are located on opposite sides of two connected resistor regions. One of the connected resistor regions is a shallow, high resistivity implant region 60B and the other resistor region is a deep diffused or deep implanted region 61B which functions like the region 61 of FIG. 4 and provides a lower resistivity than the resistor region 60B. The letter B has been added to corresponding reference numerals in FIG. 3 for showing similar elements in FIG. 5.

Figure 6:
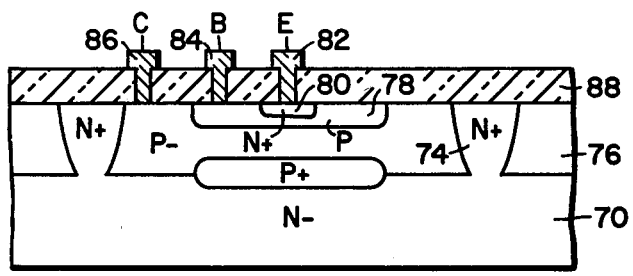
FIGS. 6, 7, and 8, respectively, depict PNP, P Channel MOS and Lateral PNP devices having shallow, low resistivity semiconductor regions fabricated like the resistor regions of FIGS. 2A and 2B, but with a significantly higher impurity concentration.

Referring to FIG. 6, a PNP transistor structure is shown having a very shallow P type emitter region and also a very shallow N type base region formed by an ion implantation process similar to what is shown in FIGS. 2A and 2B, but with the change that the base and emitter regions are of much lower resistivity than the shallow, high resistivity region of FIGS. 2A and 2B. The PNP transistor structure of FIG. 6 is shown in integrated form having a substrate 70 of N− type conductivity, a P+ subcollector region 72, an N− isolation region 74 and P− type epitaxial region 76. Located within the central P− epitaxial region 76 and surrounded by the N+ isolation region 74 is a PNP transistor device which has a shallow P type base region 78 (preferably formed by ion implanted phosphorous or arsenic ions) and a N+ shallow boron implanted region 80 serving as the emitter. Contacts 82, 84 and 86 serve as ohmic contacts through a silicon dioxide layer 88 to provide electrical contact to the emitter, base, and collector regions, respectively.

Figure 7:
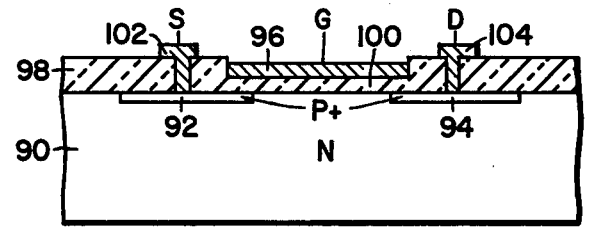

Referring to FIG. 7, an MOS type device is shown having shallow P+ type source and drain regions. The MOS device of FIG. 7 has an N type substrate region 90 which serves as the basic substrate for the MOS device structure. A shallow P+ source region 92 and a shallow P+ drain region 94 are located in the N type substrate 90 and provide source and drain regions for the MOS device. A gate electrode 96 is formed on a silicon dioxide layer 98 over a thin oxide layer portion 100 in order to function as a gate for providing or controlling a conductive channel between the source region 92 and the drain region 94 as is done in conventional MOS devices. A source contact 102 is provided to the thin source region 92 and a drain contact 104 is provided to the thin drain region 94 through openings in the silicon dioxide layer 98. The P+ regions 92 and 94 are formed by ion implantation techniques through a thin silicon dioxide layer as is done with reference to FIGS. 2A and 2B in the formation of the thin, shallow P type implanted region shown therein for making the resistor device thereof.

Figure 8:
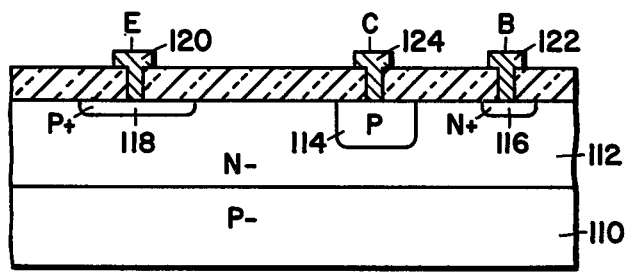

Referring to FIG. 8, a lateral PNP device is shown as part of an integrated semiconductor structure portion which included NPN transistors (not shown). The lateral PNP transistor device is formed during the formation of the bipolar integrated structure. For example, the starting substrate 110 is of P− type conductivity. An N− epitaxial layer 112 is formed on the P-substrate 110 as is shown with reference to FIGS. 2A and 2B. A P type base region 114 (preferably diffused) is the collector region of the PNP lateral transistor device of FIG. 8. An N+ diffused region 116 which is formed during an emitter type diffusion step provides the base contact for the lateral PNP transistor device structure of FIG. 8. A P+ shallow emitter region 118 is located within the N− epitaxial layer 112 and is formed by carrying out an ion implantation step (as is done with respect to the shallow resistor device of FIGS. 2A and 2B as is done for the emitter region 80 of FIG. 6 of the PNP device shown there and the P+ source and drain regions 92 and 94 of FIG. 7).

Metal ohmic contacts 120, 122 and 124 are provided to the emitter base and collector regions, respectively, of this lateral PNP transistor device. The metal ohmic contacts to the shallow regions (80 and 78 of FIG. 6, 92 and 94 of FIG. 7, and 118 of FIG. 8) are shallow, preferably, sintered contacts doped with, for example, silicon to prevent deep penetration through the shallow semiconductor connecting region.

Thus, high speed and/or high density semiconductor devices can be fabricated using very shallow, high, intermediate or low resistivity regions in accordance with this invention.

While the invention has been particularly shown and described with reference to a preferred embodiment thereof, it will be understood by those skilled in the art that other changes in form and detail and omissions may be made therein without departing from the spirit and scope of the invention.

What is claimed is:

1. A method for making a high resistivity semiconductor resistor device displaying stable resistivity characteristics during processing steps subsequent to the formation of said high resistivity semiconductor resistor comprising the steps of:
   forming a thin insulating layer on a surface of a semiconductor substrate;
   forming spaced resistor contact regions into a surface portion of said semiconductor substrate;
   forming a shallow, stable high resistivity region of the same conductivity as said spaced resistor contact regions by implanting ions through said thin insulating layer into a surface portion of said semiconductor to provide a high resistivity conduction path between said spaced resistor contact regions; and
   forming electrical contacts to said spaced resistor contact regions.

2. A method in accordance with claim 1 including the step of forming a photoresist layer on said thin insulating layer and creating an opening in said photoresist layer before ion implanting the shallow high resistivity region.

3. A method in accordance with claim 2 including the step of etching away a portion of said thin insulating layer prior to forming electrical contacts to said spaced resistor contact regions.

4. A method in accordance with claim 3 including the step of removing the photoresist layer between the step of etching away a portion of said thin insulating layer and the step of forming the electrical contacts to said spaced resistor contact regions.

* * * * *